(12) United States Patent
Qin

(10) Patent No.: US 12,407,174 B2
(45) Date of Patent: Sep. 2, 2025

(54) BATTERY EQUALIZATION SELF-DISCHARGING CIRCUIT AND UNMANNED AERIAL VEHICLE

(71) Applicant: AUTEL ROBOTICS CO., LTD., Guangdong (CN)

(72) Inventor: Wei Qin, Guangdong (CN)

(73) Assignee: AUTEL ROBOTICS CO., LTD., Guangdong (CN)

( * ) Notice: Subject to any disclaimer, the term of this patent is extended or adjusted under 35 U.S.C. 154(b) by 809 days.

(21) Appl. No.: 17/651,499

(22) Filed: Feb. 17, 2022

(65) Prior Publication Data

US 2022/0173599 A1 Jun. 2, 2022

Related U.S. Application Data

(63) Continuation of application No. PCT/CN2020/122087, filed on Oct. 20, 2020.

(30) Foreign Application Priority Data

Aug. 20, 2019 (CN) .......................... 201910770160.7

(51) Int. Cl.
*H02J 7/00* (2006.01)
*B60L 58/22* (2019.01)
*G01R 31/3828* (2019.01)

(52) U.S. Cl.
CPC ............ *H02J 7/0016* (2013.01); *B60L 58/22* (2019.02); *G01R 31/3828* (2019.01); *H02J 7/0024* (2013.01); *B60L 2200/10* (2013.01)

(58) Field of Classification Search
CPC .. H02J 7/0016; H02J 7/0024; G01R 31/3828; B60L 58/22; B60L 2200/10

(Continued)

(56) References Cited

U.S. PATENT DOCUMENTS

| 8,305,038 | B2* | 11/2012 | Maruyama | ............ | H02J 7/0016 320/160 |
| 8,350,529 | B2* | 1/2013 | Loncarevic | ........... | H02J 7/0014 320/122 |
| 9,030,167 | B2* | 5/2015 | Yamaguchi | ......... | H01M 10/441 320/117 |

FOREIGN PATENT DOCUMENTS

| CN | 201623235 U | 11/2010 |
| CN | 201623470 U | 11/2010 |

(Continued)

OTHER PUBLICATIONS

Machine Translation of CN110350632A.*

(Continued)

*Primary Examiner* — Richard V Muralidar

(57) ABSTRACT

Embodiments of the present application relate to a battery equalization self-discharging circuit and an unmanned aerial vehicle. The circuit includes at least two battery cells and at least two battery cell equalization units, wherein the battery cell equalization unit includes a series circuit composed of a discharging load and a switch, its one end is electrically connected to one end of the battery cell, and the other end is connected to the other end of the battery cell; the battery cell connected adjacent to a second electrode of a battery is a third battery cell; the battery equalization unit of the third battery cell includes a third discharging load and a third switch; and the battery equalization circuit further includes a fourth switch and a current detection unit, and a second end of the third discharging load is connected to a second end of the third battery cell.

20 Claims, 3 Drawing Sheets

(58) Field of Classification Search
USPC .......................................... 320/118, 122, 124
See application file for complete search history.

(56) References Cited

FOREIGN PATENT DOCUMENTS

| | | | | |
|---|---|---|---|---|
| CN | 102754301 | A | 10/2012 | |
| CN | 202616757 | U | 12/2012 | |
| CN | 103746346 | A | 4/2014 | |
| CN | 104303390 | A | 1/2015 | |
| CN | 204334058 | U | 5/2015 | |
| CN | 108110868 | A | 6/2018 | |
| CN | 208272671 | U | 12/2018 | |
| CN | 109120251 | A | 1/2019 | |
| CN | 208368670 | U | 1/2019 | |
| CN | 109768590 | A | 5/2019 | |
| CN | 110350632 | A * | 10/2019 | .............. B60L 58/21 |
| CN | 110568804 | A | 12/2019 | |
| CN | 210327082 | U | 4/2020 | |
| JP | 2009159768 | A | 7/2009 | |

OTHER PUBLICATIONS

PCT International Search Report mailed Jan. 18, 2021; PCT/CN2020/122087.
The First Office Action of the CN Priority Application; Dated Dec. 21, 2023; Appln. No. 201910770160.7 With English Translation.

* cited by examiner

BATTERY EQUALIZATION SELF-DISCHARGING CIRCUIT AND UNMANNED AERIAL VEHICLE

CROSS REFERENCE

The present application is a continuation of International Application No. PCT/CN2020/122087, filed on Oct. 20, 2020, which claims priority to Chinese patent application No. 2019107701607, filed on Aug. 20, 2019, which is incorporated herein by reference in its entirety.

BACKGROUND

Technical Field

Embodiments of the present invention relate to the technical field of batteries, in particular to a battery equalization self-discharging circuit and an unmanned aerial vehicle.

Related Art

A high-rate lithium battery is more and more widely used. While the high-rate lithium battery is stored for a long time, if the battery electric quantity is higher than a safe value, there is a danger of swelling. Therefore, while the battery electric quantity is too high, the battery needs to be self-discharged. While the high-rate lithium battery is formed by connecting a plurality of battery cells in series, due to differences in the quality of the battery cells, assembly modes, and using environments and the like, voltages and electric quantities of the battery cells may gradually become unbalanced. The unbalanced voltages may cause problems such as inaccurate electric quantity and electric quantity jump, and a potential safety hazard is brought. Therefore, it is necessary to perform voltage equalization processing on each battery cell in the battery. At present, self-discharge processing and voltage equalization processing are respectively performed by using complicated circuits. This scheme is complicated in circuit, and higher in cost.

SUMMARY

A purpose of embodiments of the present invention is to provide a battery equalization self-discharging circuit and an unmanned aerial vehicle, two functions of battery self-discharge and battery equalization may be achieved by using the same circuit, the circuit is simple, and the cost is low.

In order to solve the above technical problems, a technical scheme adopted by the present invention is: a battery equalization self-discharging circuit, the circuit includes:
a microprocessor, at least two battery cells connected in series between a first electrode of a battery and a second electrode of the battery, and at least two battery cell equalization units for equalizing voltages of the at least two battery cells respectively;
each of the battery cell equalization units includes a discharging load and a switch connected in series, the discharging load is electrically connected to one end of a battery cell corresponding to the battery cell equalization unit, and the switch is electrically connected to the other end of the battery cell corresponding to the battery cell equalization unit, a control end of the switch is electrically connected to the microprocessor;
in the at least two battery cells, the battery cell connected adjacent to the second electrode of the battery is a third battery cell, a first end of the third battery cell is connected to other battery cells in the at least two battery cells, and a second end of the third battery cell is connected to the second electrode of the battery;
the battery equalization unit corresponding to the third battery cell includes a third discharging load and a third switch, a first end of the third discharging load is connected to the first end of the third battery cell, a second end of the third discharging load is connected to a first end of the third switch, and a second end of the third switch is connected to the second end of the third battery cell; and
the battery equalization self-discharging circuit further includes a fourth switch and a current detection unit, the second end of the third discharging load is connected to the second end of the third battery cell through the fourth switch and the current detection unit sequentially, and a control end of the fourth switch is connected to the microprocessor.

In some of the embodiments, the battery equalization self-discharging circuit further includes at least one driving switch, some or all of the switches are electrically connected to the microprocessor through one of the driving switches respectively, and the driving switch is used to control on/off of the switches.

In some of the embodiments, in the at least two battery cells, the battery cell connected adjacent to the first electrode of the battery is a first battery cell, a first end of the first battery cell is connected to the first electrode of the battery, and a second end of the first battery cell is connected to other battery cells; and
the battery equalization unit corresponding to the first battery cell includes a first discharging load and a first switch, and a control end of the first switch is connected to the microprocessor through a first driving switch.

In some of the embodiments, the at least two battery cells further include a second battery cell, a first end and a second end of the second battery cell are both connected to other battery cells, and a first end voltage of the second battery cell is higher than a second end voltage of the second battery cell; and
the battery equalization unit of the second battery cell includes a second discharging load and a second switch, and a control end of the second switch is connected to the microprocessor through a second driving switch.

In some of the embodiments, the battery equalization self-discharging circuit further includes a first resistor and a fifth resistor;
a first end of the first driving switch is connected to the control end of the first switch, the first end of the first driving switch is also connected to the first end of the first battery cell through the first resistor, a control end of the first driving switch is connected to the microprocessor, and a second end of the first driving switch is connected to a second voltage; and
a first end of the second driving switch is connected to the control end of the second switch, the first end of the second driving switch is also connected to the first end of the second battery cell through the fifth resistor, a control end of the second driving switch is connected to the microprocessor, and a second end of the second driving switch is connected to the second voltage.

In some of the embodiments, the battery equalization self-discharging circuit further includes a second resistor, a seventh resistor and a tenth resistor;
the second resistor is connected between the control end of the first driving switch and the microprocessor;

the seventh resistor is connected between the control end of the second driving switch and the microprocessor; and the tenth resistor is connected between the control end of the third switch and the microprocessor.

In some of the embodiments, the battery equalization self-discharging circuit further includes a fourth resistor, an eighth resistor, an eleventh resistor and a twelfth resistor;

the control end of the first driving switch is also connected to a second voltage through the fourth resistor;

the control end of the second driving switch is also connected to the second voltage through the eighth resistor;

the control end of the third switch is also connected to the second voltage through the eleventh resistor; and the control end of the fourth switch is also connected to the second voltage through the twelfth resistor.

In some of the embodiments, the battery equalization self-discharging circuit further includes a battery output first electrode, a battery output second electrode, a charging switch and a discharging switch;

the first electrode of the battery is connected to the output first electrode through the charging switch and the discharging switch; and a common connecting end of the fourth switch and the current detection unit is connected to the battery output second electrode.

In some of the embodiments, the second end of the third battery cell is also connected to a first voltage.

In order to solve the above technical problems, another technical scheme adopted by the present invention is: an unmanned aerial vehicle, the unmanned aerial vehicle includes:

a body;

a wing connected to the body; and the above battery equalization self-discharging circuit, herein the battery equalization self-discharging circuit is arranged on the body.

In the embodiments of the present invention, the battery cell equalization unit formed by the discharging load and the switch is arranged for each battery cell connected in series, and the switch is arranged to control the battery cell equalization unit. While a certain battery cell needs to be voltage-equalized, the corresponding battery cell equalization unit may be controlled to work by the switch, so the battery cell is discharged. The battery equalization self-discharging circuit of the embodiment of the present invention further includes the fourth switch and the current detection unit, and the second end of the third discharging load is also connected to the second end of the third battery cell through the fourth switch and the current detection unit sequentially. By controlling the switches other than the third switch to be turned on, a discharging loop is formed between the first electrode of the battery and the second electrode of the battery, and the battery is self-discharged. The embodiments of the present invention achieve two functions of battery equalization and self-discharge by using the same circuit, few elements and components are used, the cost is low and a space is saved.

BRIEF DESCRIPTION OF THE DRAWINGS

One or more embodiments are exemplarily described by pictures in corresponding drawings thereof, these exemplary descriptions do not constitute limitation to the embodiments, and elements with the same reference number sign in the drawings are represented as the similar elements. Unless otherwise stated, figures in the drawings do not constitute scale limitation.

DETAILED DESCRIPTION

Figure 1:
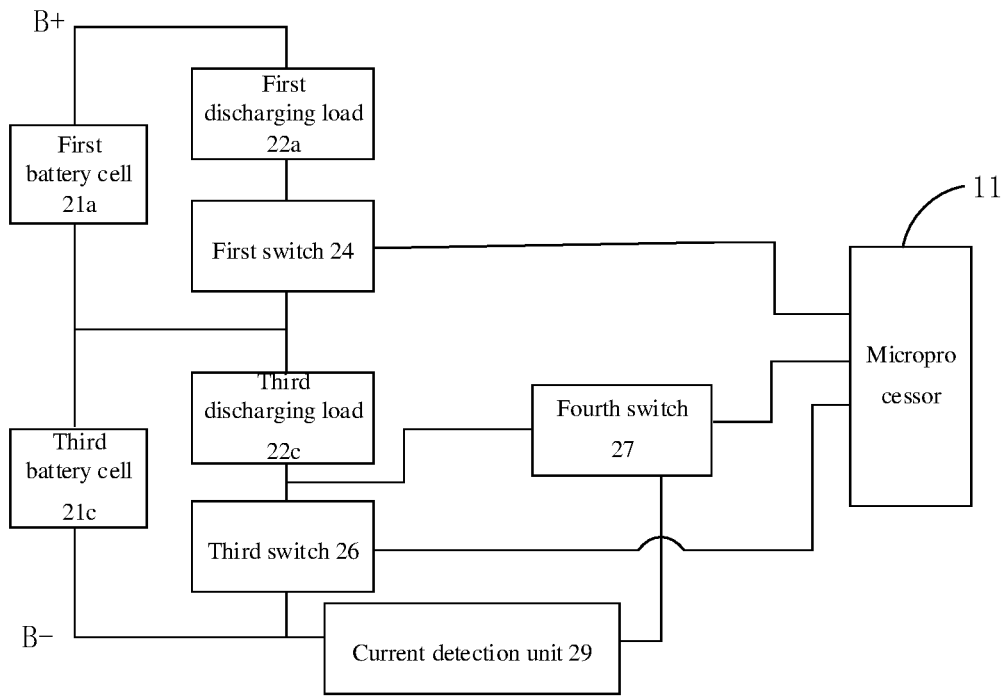
FIG. 1 is a structure schematic diagram of an embodiment of a battery equalization self-discharging circuit of the present invention.

In order to understand the present invention conveniently, technical schemes of the present invention are clearly and completely described below with reference to the drawings. Apparently, the embodiments described are a part of the embodiments of the present invention, but not all of the embodiments. Based on the embodiments of the present invention, all other embodiments obtained by those of ordinary skill in the art without creative work shall fall within a scope of protection of the present invention.

In the description of the present invention, it should be noted that orientation or position relationships indicated by terms "center", "upper", "lower", "left", "right", "vertical", "horizontal", "inner", "outer" and the like are based on the orientation or position relationships shown in the drawings, and are only for convenience of describing the present invention and simplifying the description, rather than indicating or implying that a device or an element indicated must have a specific orientation, and be constructed and operated in the specific orientation. Therefore, it should not be construed as limiting the invention. In addition, terms "first" and "second" are used for descriptive purposes only, and should not be construed to indicate or imply the relative importance.

In the description of the present invention, it should be noted that unless otherwise expressly specified and limited, terms "mounted", "connected" and "linked" should be understood in a broad sense, for example, it may be a fixed connection, or may be a detachable connection, or an integrated connection; it may be a mechanical connection, or may be an electrical connection; and it may be a direct connection, or may be an indirect connection through an intermediate medium, or may be an internal communication between two elements. For those of ordinary skill in the art, the specific meanings of the above terms in the present invention may be understood in specific situations.

In addition, the technical features involved in the different embodiments of the present invention described below may be combined with each other as long as they do not conflict with each other.

In the technical field of batteries, in order to increase the battery capacity, a plurality of battery cells is often used to connect in series to form a battery. However, the plurality of the battery cells connected in series often has a problem of inconsistent voltages, and it may bring many problems to the use of the battery. While the battery is stored for a long time, if the battery electric quantity is higher than a safe value, there is a danger of swelling. Therefore, it is necessary to perform voltage equalization processing on each battery cell in the battery, and perform discharge processing while the battery voltage is too high. The embodiment of the present invention provides a battery equalization self-discharging circuit, two functions of battery equalization and self-discharge may be achieved by using the same circuit.

FIG. 1 exemplarily shows one of structures of the battery equalization self-discharging circuit. The battery equalization self-discharging circuit includes at least two battery cells and at least two battery cell equalization units, the at least two battery cells are connected in series between a first electrode of a battery and a second electrode of the battery, the number of the battery cell equalization units is consistent with the number of the battery cells, and the battery cell equalization unit is used to adjust voltages of the battery cells, as to equalize the voltage of each battery cell in the battery.

Herein, the first electrode of the battery may be a battery positive electrode B+, and the second electrode of the battery may be a battery negative electrode B−. In the embodiment shown in FIG. 1, the battery equalization self-discharging circuit includes a first battery cell 21a and a third battery cell 21c connected in series between the battery positive electrode B+ and the battery negative electrode B−. The battery equalization unit of the first battery cell 21a includes a first discharging load 22a and a first switch 24, a first end of the first discharging load 22a is connected to a first end (namely the battery positive electrode B+) of the first battery cell 21a, a second end of the first discharging load 22a is connected to a second end of the first switch 24, and a first end of the first switch 24 is connected to a second end of the first battery cell 21a. A control end of the first switch 24 is connected to a microprocessor 11.

In the embodiment shown in FIG. 1, the first discharging load 22a is connected to a positive electrode of the first battery cell 21a, and the first switch 24 is connected to a negative electrode of the first battery cell 21a. In other embodiments, the first discharging load 22a may also be connected to the negative electrode of the first battery cell 21a, and the first switch 24 may be connected to the positive electrode of the first battery cell 21a, as long as a series connection relationship between the first discharging load 22a and the first switch 24 is satisfied.

The third battery cell 21c is connected adjacent to the battery negative electrode B−, a first end of the third battery cell 21c is connected to the first battery cell 21a, and a second end is connected to the battery negative electrode B−. The battery equalization unit of the third battery cell 21c includes a third discharging load 22c and a third switch 26, a first end of the third discharging load 22c is connected to the first end of the third battery cell 21c, a second end of the third discharging load 22c is connected to a first end of the third switch 26, and a second end of the third switch 26 is connected to a second end (namely the battery negative electrode B−) of the third battery cell 21c.

The battery equalization self-discharging circuit further includes a fourth switch 27 and a current detection unit 29, the second end of the third discharging load 22c is also connected to the second end of the third battery cell through the fourth switch 27 and the current detection unit 29 sequentially, and a control end of the four switch 27 is connected to the microprocessor 11.

While the first switch 24 is closed, the first discharging load 22a discharges the first battery cell 21a, and while the third switch 26 is closed, the third discharging load 22c discharges the third battery cell 21c. While the first switch 24 and the fourth switch 27 are closed at the same time, a self-discharging loop is formed, and a current flows through the battery positive electrode B+, the first discharging load 22a, the first switch 24, the third discharging load 22c, the fourth switch 27, the current detection unit 29 and the battery negative electrode B− sequentially, as to achieve a purpose of battery discharge.

Herein, it may be judged whether the battery voltage is too high by the current detection unit 29, and while the battery voltage is too high, the first switch 24 and the fourth switch 27 are closed to discharge the battery. If it is detected that the battery voltage is returned to normal, the battery discharge is stopped. In some of the embodiments, a function of the current detection unit 29 may be achieved by using a resistor.

Herein, in order to judge which battery cell in the battery needs to be voltage-equalized, a separate detection unit or some pins of the microprocessor may be used to detect the voltage of each battery cell. If it is found by detection that the voltage of each battery cell is unbalance, a difference between them is calculated, thereby the equalization control is performed according to the difference. Herein, a method that the voltage of each battery cell is detected, a voltage deviation value is calculated, and the equalization control is performed according to the voltage deviation belongs to the prior art, and it is not repeatedly described here.

Herein, the microprocessor may be any suitable processors with computing and logic control functions, such as a single-chip microcomputer.

In the embodiments of the present invention, the battery cell equalization unit formed by the discharging load and the switch is arranged for each battery cell connected in series, and the switch is arranged to control the battery cell equalization unit. While a certain battery cell needs to be voltage-equalized, the corresponding battery cell equalization unit may be controlled to work by the switch, so the battery cell is discharged. The embodiment of the present invention is further provided with the fourth switch and the current detection unit, and the discharging loop is formed between the first electrode of the battery and the second electrode of the battery, as to self-discharge the battery. The embodiments of the present invention achieve two functions of battery equalization and self-discharge by using the same circuit, few elements and components are used, the cost is low and a space is saved.

Figure 2:
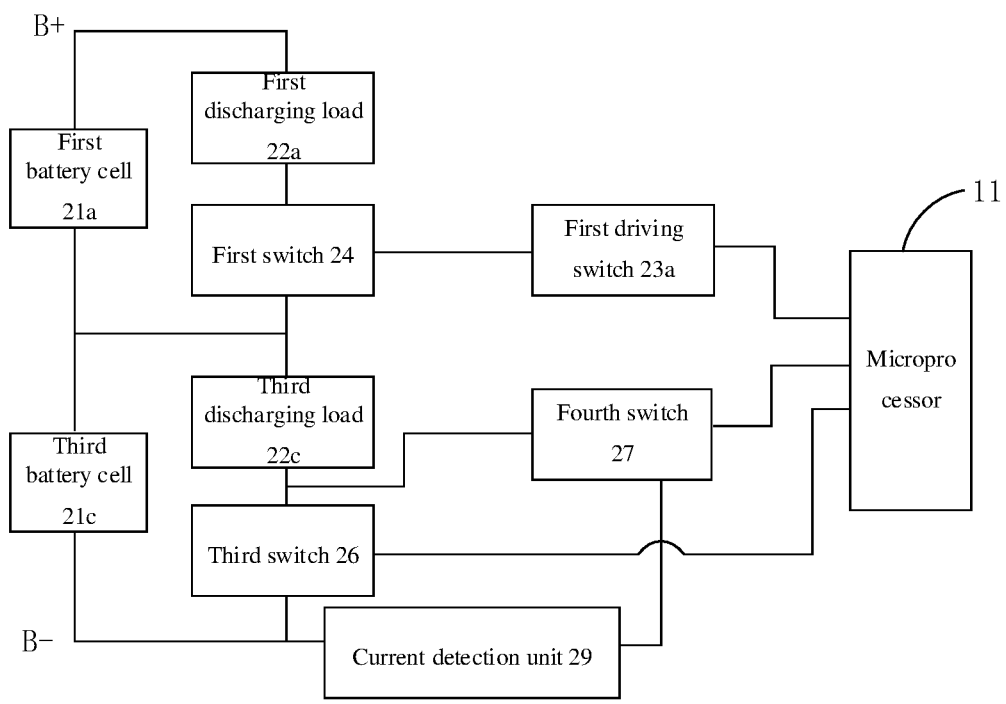
FIG. 2 is a structure schematic diagram of an embodiment of the battery equalization self-discharging circuit of the present invention.

In some of the embodiments, the switch (for example, the first switch 24 in FIG. 1) close to the battery positive electrode B+ may have a higher starting voltage, and a voltage output by the microprocessor may not be enough to start the switch. Therefore, a driving switch may be arranged between the switch and the microprocessor 11. As shown in FIG. 2, a first driving switch 23a is arranged between the first switch 24 and a control pin of the microprocessor 11, and the driving switch is used to control on/off of the first switch 24, herein a control end of the first driving switch 23a is connected to the microprocessor 11.

Figure 3:
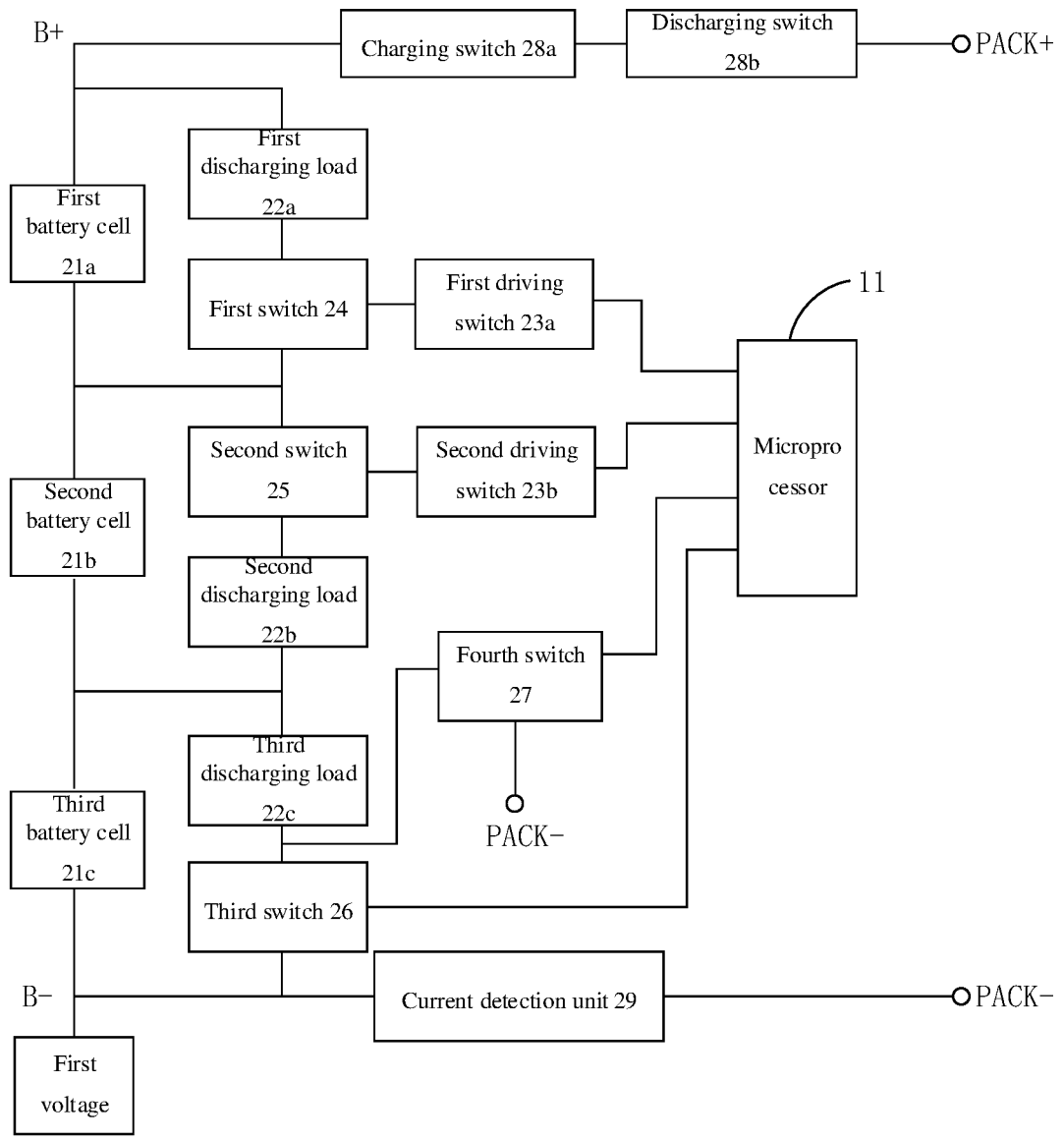
FIG. 3 is a structure schematic diagram of an embodiment of the battery equalization self-discharging circuit of the present invention.

FIG. 1 and FIG. 2 show a situation that the battery includes two battery cells. In other embodiments, the battery may also include more battery cells, and FIG. 3 shows a situation that the battery includes three battery cells. In the embodiment shown in FIG. 3, the battery includes a first battery cell 21a, a second battery cell 21b and a third battery cell 21c connected in series. The battery equalization unit of the first battery cell 21a is formed by a first discharging load 22a and a first switch 24, the battery equalization unit of the second battery cell 21b is formed by a second switch 25 and a second discharging load 22b, and the battery equalization unit of the third battery cell 21c is formed by a third discharging load 22c and a third switch 26. A second end of the second switch 25 is connected to a first end of the second battery cell 21*b*, a first end of the second switch 25 is connected to a first end of the second discharging load 22*b*, a second end of the second discharging load 22*b* is connected to a second end of the second battery cell 21*b*, and a control end of the second switch 25 is connected to the microprocessor. Herein, the first switch 24 and the second switch 25 are respectively driven by a first driving switch 23*a* and a second driving switch 23*b*, and the third switch 26 is directly controlled by the microprocessor.

While the first switch 24, the second switch 25 and the fourth switch 27 are closed, a current flows through the battery positive electrode B+, the first discharging load 22*a*, the first switch 24, the second switch 25, the second discharging load 22*b*, the three discharging loads 22*c*, the fourth switch 27, the current detection unit 29 and the battery negative electrode B− sequentially, as to self-discharge the battery.

In practical applications, a charging switch 28*a* and a discharging switch 28*b* may be arranged between a battery output first electrode PACK+ and the battery positive electrode B+, as to control battery charge and discharge, and a common connecting end of the fourth switch 27 and the current detection unit 29 is used as a battery output second electrode PACK−. The battery negative electrode B− may also be connected to a first voltage, and in some embodiments, the first voltage is a ground end GND.

Specifically, in some embodiments, the first discharging load 22*a*, the second discharging load 22*b* and the third discharging load 22*c* may be discharged by using resistors. The first switch 24, the second switch 25, the third switch 26, the fourth switch 27, the first driving switch 23*a*, the second driving switch 23*b*, the charging switch 28*a* and the discharging switch 28*b* may be a metal-oxide-semiconductor (MOS) field effect transistor. In a situation that each switch adopts the MOS field effect transistor, the first end is a drain electrode, the second end is a source electrode, and the control end is a gate electrode. In some of the embodiments, each switch may also include a diode across its source electrode and drain electrode.

Figure 4:
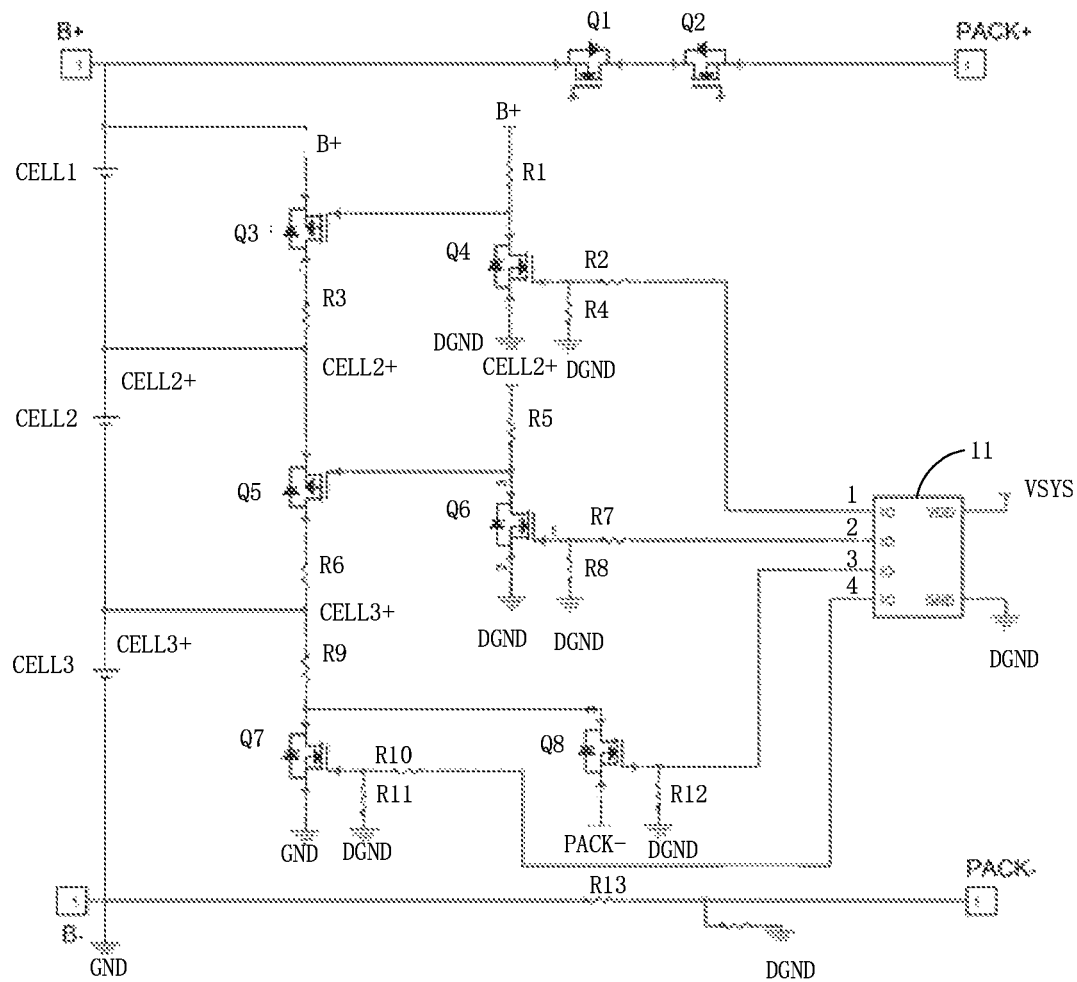
FIG. 4 is a structure schematic diagram of an embodiment of the battery equalization self-discharging circuit of the present invention.

FIG. 4 shows another structure of the battery equalization self-discharging circuit. As shown in FIG. 4, the battery includes a first battery cell CELL1, a second battery cell CELL2 and a third battery cell CELL3 connected in series. The battery equalization unit of the first battery cell CELL1 is a series circuit formed by a MOS transistor Q3 and a resistor R3, and the MOS transistor Q3 is driven by a MOS transistor Q4. A gate electrode of the MOS transistor Q4 is connected to the microprocessor, a source electrode is connected to a second voltage, and a drain electrode is connected to a positive electrode of the first battery cell CELL1 through the resistor R1. In some of the embodiments, the gate electrode of the MOS transistor Q4 may also be connected to a current limiting resistor R2, and connected to the second voltage through a resistor R4. Herein, the second voltage is a low voltage, and it may guarantee that Q4 is in a cut-off state while a control signal is not received, as to prevent the battery from being discharged by mistake. In some of the embodiments, the second voltage may be digital ground DGND.

The battery equalization unit of the second battery cell CELL2 is a series circuit formed by a MOS transistor Q5 and a resistor R6, and the MOS transistor Q5 is driven by a MOS transistor Q6. A gate electrode of the MOS transistor Q6 is connected to the microprocessor, a source electrode is connected to the second voltage, and a drain electrode is connected to a positive electrode of the second battery cell CELL2 through a resistor R5. In some of the embodiments, the gate electrode of the MOS transistor Q6 may also be connected to a current limiting resistor R7, and connected to the second voltage through a resistor R8.

The battery equalization unit of the third battery cell CELL3 is a series circuit formed by a MOS transistor Q7 and a resistor R9, and the MOS transistor Q7 is directly driven by the microprocessor. In some of the embodiments, a current limiting resistor R10 is further connected between a gate electrode of the MOS transistor Q7 and the microprocessor, and the gate electrode of the MOS transistor Q7 is also connected to the second voltage through a resistor R11.

The fourth switch includes a MOS transistor Q8, and the MOS transistor Q8 is directly driven by the microprocessor. In some of the embodiments, a gate electrode of the MOS transistor Q8 is further connected to the second voltage through a resistor R12.

If it is necessary to equalize the discharge of the first battery cell CELL1, a pin 1 of the microprocessor 11 outputs a high level, and the other three pins output a low level, then Q4 is turned on, the gate electrode of Q3 becomes the low level, Q3 is turned on, and CELL1 performs the discharge equalization through the resistor R3. If the second battery cell CELL2 needs to be discharge-equalized, a pin 2 of the microprocessor 11 outputs a high level, and the other three pins output a low level, then Q6 is turned on, the gate electrode of Q5 becomes the low level, Q5 is turned on, and CELL2 performs the discharge equalization through the resistor R6.

If the battery needs to be self-discharged, the pin 1, the pin 2 and the pin 3 of the microprocessor 11 output a high level, and a pin 4 outputs a low level, then Q3, Q5 and Q8 are all turned on, and the battery is self-discharged.

In the embodiment shown in FIG. 4, Q1, Q2, Q4, Q6, Q8 and Q7 are an N-channel field effect transistor, and Q3 and Q5 are a P-channel field effect transistor. In other embodiments, Q1, Q2, Q3, Q4, Q5, Q6, Q8 and Q7 may also adopt other types of switching transistors, as long as the above control logic may be achieved.

The battery equalization self-discharging circuit of the embodiment of the present invention may be applied to an unmanned aerial vehicle, as to perform battery equalization control on a battery of the unmanned aerial vehicle, herein the unmanned aerial vehicle may be any suitable unmanned aerial vehicles, including a fixed-wing unmanned aerial vehicle and a rotary-wing unmanned aerial vehicle, for example a helicopter, a quadcopter, and aircrafts with other numbers of rotors and/or rotor configurations. The unmanned aerial vehicle may also be other movable objects, for example a manned aircraft, a model aircraft, an unmanned airship, an unmanned hot air balloon and a robot. In some of the embodiments, the unmanned aerial vehicle includes a body, an arm connected to the body, and a power system arranged on the arm, and the battery equalization self-discharging circuit may be arranged on the body.

It should be noted that the description of the present invention and the drawings thereof provide preferred embodiments of the present invention, however, the present invention may be achieved in many different forms, and is not limited to the embodiments described in this description. These embodiments are not intended as additional limitation to the content of the present invention, and are provided for the purpose of providing more thorough and complete understanding of the disclosed content of the present invention. In addition, the above technical features continue to be combined with each other to form various embodiments which are not listed above, and are all regarded as a recorded scope of the description of the present invention; and further, for those of ordinary skill in the art, improvements or transformations may be made according to the above descriptions, and all these improvements and transformations should belong to a scope of protection of the appended claims of the present invention.

The invention claimed is:

1. A battery equalization self-discharging circuit, wherein the circuit comprises:
   a microprocessor, at least two battery cells connected in series between a first electrode of a battery and a second electrode of the battery, and at least two battery cell equalization units for equalizing voltages of the at least two battery cells respectively;
   each of the battery cell equalization units comprises a discharging load and a switch connected in series, the discharging load is electrically connected to one end of a battery cell corresponding to the battery cell equalization unit, and the switch is electrically connected to the other end of the battery cell corresponding to the battery cell equalization unit, a control end of the switch is electrically connected to the microprocessor;
   in the at least two battery cells, the battery cell connected adjacent to the second electrode of the battery is a third battery cell, a first end of the third battery cell is connected to other battery cells in the at least two battery cells, and a second end of the third battery cell is connected to the second electrode of the battery;
   the battery equalization unit corresponding to the third battery cell comprises a third discharging load and a third switch, a first end of the third discharging load is connected to the first end of the third battery cell, a second end of the third discharging load is connected to a first end of the third switch, and a second end of the third switch is connected to the second end of the third battery cell; and
   the battery equalization self-discharging circuit further comprises a fourth switch and a current detection unit, the second end of the third discharging load is connected to the second end of the third battery cell through the fourth switch and the current detection unit sequentially, and a control end of the fourth switch is connected to the microprocessor.

2. The battery equalization self-discharging circuit according to claim 1, wherein the battery equalization self-discharging circuit further comprises at least one driving switch, some or all of the switches are electrically connected to the microprocessor through one of the driving switches respectively, and the driving switch is used to control on/off of the switches.

3. The battery equalization self-discharging circuit according to claim 2, wherein in the at least two battery cells, the battery cell connected adjacent to the first electrode of the battery is a first battery cell, a first end of the first battery cell is connected to the first electrode of the battery, and a second end of the first battery cell is connected to other battery cells; and
   the battery equalization unit corresponding to the first battery cell comprises a first discharging load and a first switch, and a control end of the first switch is connected to the microprocessor through a first driving switch.

4. The battery equalization self-discharging circuit according to claim 3, wherein the at least two battery cells further comprise a second battery cell, a first end and a second end of the second battery cell are both connected to other battery cells, and a first end voltage of the second battery cell is higher than a second end voltage of the second battery cell; and
   the battery equalization unit of the second battery cell comprises a second discharging load and a second switch, and a control end of the second switch is connected to the microprocessor through a second driving switch.

5. The battery equalization self-discharging circuit according to claim 4, wherein the battery equalization self-discharging circuit further comprises a first resistor and a fifth resistor;
   a first end of the first driving switch is connected to the control end of the first switch, the first end of the first driving switch is also connected to the first end of the first battery cell through the first resistor, a control end of the first driving switch is connected to the microprocessor, and a second end of the first driving switch is connected to a second voltage; and
   a first end of the second driving switch is connected to the control end of the second switch, the first end of the second driving switch is also connected to the first end of the second battery cell through the fifth resistor, a control end of the second driving switch is connected to the microprocessor, and a second end of the second driving switch is connected to the second voltage.

6. The battery equalization self-discharging circuit according to claim 5, wherein the battery equalization self-discharging circuit further comprises a second resistor, a seventh resistor and a tenth resistor;
   the second resistor is connected between the control end of the first driving switch and the microprocessor;
   the seventh resistor is connected between the control end of the second driving switch and the microprocessor; and
   the tenth resistor is connected between the control end of the third switch and the microprocessor.

7. The battery equalization self-discharging circuit according to claim 4, wherein the battery equalization self-discharging circuit further comprises a fourth resistor, an eighth resistor, an eleventh resistor and a twelfth resistor;
   the control end of the first driving switch is also connected to a second voltage through the fourth resistor;
   the control end of the second driving switch is also connected to the second voltage through the eighth resistor;
   the control end of the third switch is also connected to the second voltage through the eleventh resistor; and
   the control end of the fourth switch is also connected to the second voltage through the twelfth resistor.

8. The battery equalization self-discharging circuit according to claim 5, wherein the battery equalization self-discharging circuit further comprises a fourth resistor, an eighth resistor, an eleventh resistor and a twelfth resistor;
   the control end of the first driving switch is also connected to a second voltage through the fourth resistor;
   the control end of the second driving switch is also connected to the second voltage through the eighth resistor;
   the control end of the third switch is also connected to the second voltage through the eleventh resistor; and
   the control end of the fourth switch is also connected to the second voltage through the twelfth resistor.

9. The battery equalization self-discharging circuit according to claim 6, wherein the battery equalization self-discharging circuit further comprises a fourth resistor, an eighth resistor, an eleventh resistor and a twelfth resistor;

the control end of the first driving switch is also connected to a second voltage through the fourth resistor;

the control end of the second driving switch is also connected to the second voltage through the eighth resistor;

the control end of the third switch is also connected to the second voltage through the eleventh resistor; and the control end of the fourth switch is also connected to the second voltage through the twelfth resistor.

10. The battery equalization self-discharging circuit according to claim 1, wherein the battery equalization self-discharging circuit further comprises a battery output first electrode, a battery output second electrode, a charging switch and a discharging switch;

the first electrode of the battery is connected to the output first electrode through the charging switch and the discharging switch; and a common connecting end of the fourth switch and the current detection unit is connected to the battery output second electrode.

11. The battery equalization self-discharging circuit according to claim 1, wherein the second end of the third battery cell is also connected to a first voltage.

12. An unmanned aerial vehicle, wherein the unmanned aerial vehicle comprises:

a body;

one or more arms integrally or fixedly connected to the body;

a power unit mounted on the arm; and a battery equalization self-discharging circuit, wherein the battery equalization self-discharging circuit is arranged on the body, and the circuit comprises:

a microprocessor, at least two battery cells connected in series between a first electrode of a battery and a second electrode of the battery, and at least two battery cell equalization units for equalizing voltages of the at least two battery cells respectively;

each of the battery cell equalization units comprises a discharging load and a switch connected in series, the discharging load is electrically connected to one end of a battery cell corresponding to the battery cell equalization unit, and the switch is electrically connected to the other end of the battery cell corresponding to the battery cell equalization unit, a control end of the switch is electrically connected to the microprocessor;

in the at least two battery cells, the battery cell connected adjacent to the second electrode of the battery is a third battery cell, a first end of the third battery cell is connected to other battery cells in the at least two battery cells, and a second end of the third battery cell is connected to the second electrode of the battery;

the battery equalization unit corresponding to the third battery cell comprises a third discharging load and a third switch, a first end of the third discharging load is connected to the first end of the third battery cell, a second end of the third discharging load is connected to a first end of the third switch, and a second end of the third switch is connected to the second end of the third battery cell; and the battery equalization self-discharging circuit further comprises a fourth switch and a current detection unit, the second end of the third discharging load is connected to the second end of the third battery cell through the fourth switch and the current detection unit sequentially, and a control end of the fourth switch is connected to the microprocessor.

13. The unmanned aerial vehicle according to claim 12, wherein the battery equalization self-discharging circuit further comprises at least one driving switch, some or all of the switches are electrically connected to the microprocessor through one of the driving switches respectively, and the driving switch is used to control on/off of the switches.

14. The unmanned aerial vehicle according to claim 13, wherein in the at least two battery cells, the battery cell connected adjacent to the first electrode of the battery is a first battery cell, a first end of the first battery cell is connected to the first electrode of the battery, and a second end of the first battery cell is connected to other battery cells; and the battery equalization unit corresponding to the first battery cell comprises a first discharging load and a first switch, and a control end of the first switch is connected to the microprocessor through a first driving switch.

15. The unmanned aerial vehicle according to claim 14, wherein the at least two battery cells further comprise a second battery cell, a first end and a second end of the second battery cell are both connected to other battery cells, and a first end voltage of the second battery cell is higher than a second end voltage of the second battery cell; and the battery equalization unit of the second battery cell comprises a second discharging load and a second switch, and a control end of the second switch is connected to the microprocessor through a second driving switch.

16. The unmanned aerial vehicle according to claim 15, wherein the battery equalization self-discharging circuit further comprises a first resistor and a fifth resistor;

a first end of the first driving switch is connected to the control end of the first switch, the first end of the first driving switch is also connected to the first end of the first battery cell through the first resistor, a control end of the first driving switch is connected to the microprocessor, and a second end of the first driving switch is connected to a second voltage; and a first end of the second driving switch is connected to the control end of the second switch, the first end of the second driving switch is also connected to the first end of the second battery cell through the fifth resistor, a control end of the second driving switch is connected to the microprocessor, and a second end of the second driving switch is connected to the second voltage.

17. The unmanned aerial vehicle according to claim 16, wherein the battery equalization self-discharging circuit further comprises a second resistor, a seventh resistor and a tenth resistor;

the second resistor is connected between the control end of the first driving switch and the microprocessor;

the seventh resistor is connected between the control end of the second driving switch and the microprocessor; and the tenth resistor is connected between the control end of the third switch and the microprocessor.

18. The unmanned aerial vehicle according to claim 15, wherein the battery equalization self-discharging circuit further comprises a fourth resistor, an eighth resistor, an eleventh resistor and a twelfth resistor;

the control end of the first driving switch is also connected to a second voltage through the fourth resistor;

the control end of the second driving switch is also connected to the second voltage through the eighth resistor;

the control end of the third switch is also connected to the second voltage through the eleventh resistor; and the control end of the fourth switch is also connected to the second voltage through the twelfth resistor.

19. The unmanned aerial vehicle according to claim 16, wherein the battery equalization self-discharging circuit further comprises a fourth resistor, an eighth resistor, an eleventh resistor and a twelfth resistor;
the control end of the first driving switch is also connected to a second voltage through the fourth resistor;
the control end of the second driving switch is also connected to the second voltage through the eighth resistor;
the control end of the third switch is also connected to the second voltage through the eleventh resistor; and
the control end of the fourth switch is also connected to the second voltage through the twelfth resistor.

20. The unmanned aerial vehicle according to claim 17, wherein the battery equalization self-discharging circuit further comprises a fourth resistor, an eighth resistor, an eleventh resistor and a twelfth resistor;
the control end of the first driving switch is also connected to a second voltage through the fourth resistor;
the control end of the second driving switch is also connected to the second voltage through the eighth resistor;
the control end of the third switch is also connected to the second voltage through the eleventh resistor; and
the control end of the fourth switch is also connected to the second voltage through the twelfth resistor.

* * * * *